(12) United States Patent
Cheng

(10) Patent No.: US 11,737,206 B2
(45) Date of Patent: Aug. 22, 2023

(54) CIRCUIT BOARD STRUCTURE

(71) Applicant: Unimicron Technology Corp., Taoyuan (TW)

(72) Inventor: Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/873,153

(22) Filed: Jul. 26, 2022

(65) Prior Publication Data

US 2023/0156909 A1    May 18, 2023

Related U.S. Application Data

(60) Provisional application No. 63/279,661, filed on Nov. 15, 2021.

(30) Foreign Application Priority Data

Jun. 29, 2022 (TW) ................................. 111124282

(51) Int. Cl.
*H05K 1/02* (2006.01)
(52) U.S. Cl.
CPC ........... *H05K 1/0222* (2013.01); *H05K 1/024* (2013.01); *H05K 2201/096* (2013.01); *H05K 2201/0959* (2013.01); *H05K 2201/09509* (2013.01); *H05K 2201/09536* (2013.01)

(58) Field of Classification Search
CPC ................ H05K 1/0222–1/0227; H05K 1/024
See application file for complete search history.

(56) References Cited

U.S. PATENT DOCUMENTS 9,635,761 B2    4/2017    Brigham et al.

FOREIGN PATENT DOCUMENTS

| CN | 100367832 | 2/2008 |
|---|---|---|
| CN | 111316434 | 6/2020 |
| TW | 201220967 | 5/2012 |
| TW | I365016 | 5/2012 |
| TW | I528871 | 4/2016 |

*Primary Examiner* — Jeremy C Norris
(74) *Attorney, Agent, or Firm* — JCIPRNET

(57) ABSTRACT

A circuit board structure includes a first dielectric layer, first and second inner circuit layers, a conductive connection layer, a second dielectric layer, two third dielectric layers, third and fourth inner circuit layers, two conductive through vias, first and second annular retaining walls, two fourth dielectric layers, first and second external circuit layers, and third and fourth annular retaining walls. The conductive through vias penetrate the third and second dielectric layers and electrically connect the third and fourth inner circuit layers. The first and second annular retaining walls surround the conductive through vias and electrically connect the third and first and the fourth and second inner circuit layers. The third and fourth annular retaining walls are respectively disposed in the fourth dielectric layers and electrically connect the first external circuit layer and the third inner circuit layer and the second external circuit layer and the fourth inner circuit layer.

10 Claims, 10 Drawing Sheets

CIRCUIT BOARD STRUCTURE

CROSS-REFERENCE TO RELATED APPLICATION

This application claims the priority benefit of U.S. Provisional Application No. 63/279,661, filed on Nov. 15, 2021 and Taiwan Application No. 111124282, filed on Jun. 29, 2022. The entirety of each of the above-mentioned patent applications is hereby incorporated by reference herein and made a part of this specification.

BACKGROUND

Technical Field

The disclosure relates to a substrate structure, and in particular to a circuit board structure.

Description of Related Art

In the existing circuit board, the design of the coaxial via requires one or more insulating layers for insulation between the inner conductor layer and the outer conductor layer. The manner of forming the insulating layer is achieved through build-up lamination. Therefore, there will be impedance mismatch at two ends of the coaxial via and an electromagnetic interference (EMI) shielding notch will appear, thereby affecting the integrity of high-frequency signals.

SUMMARY

The disclosure provides a circuit board structure, which can effectively prevent energy loss and reduce noise interference to have preferred signal integrity.

A circuit board structure of the disclosure includes a first dielectric layer, a first inner circuit layer, a second inner circuit layer, a conductive connection layer, a second dielectric layer, two third dielectric layers, a third inner circuit layer, a fourth inner circuit layer, two conductive through vias, a first annular retaining wall, a second annular retaining wall, two fourth dielectric layers, a first external circuit layer, a second external circuit layer, a third annular retaining wall, and a fourth annular retaining wall. The first dielectric layer has a first surface and a second surface opposite to each other and an opening penetrating the first dielectric layer and connecting the first surface and the second surface. The first inner circuit layer is disposed on the first surface of the first dielectric layer. The second inner circuit layer is disposed on the second surface of the first dielectric layer. The conductive connection layer covers an inner wall of the opening of the first dielectric layer and connects the first inner circuit layer and the second inner circuit layer. The second dielectric layer fills the opening of the first dielectric layer. The third dielectric layer respectively covers the first inner circuit layer, the second inner circuit layer, and the second dielectric layer. The third inner circuit layer and the fourth inner circuit layer respectively cover the third dielectric layer. The conductive through vias penetrate the third dielectric layer and the second dielectric layer, and electrically connect the third inner circuit layer and the fourth inner circuit layer. The first annular retaining wall and the second annular retaining wall are respectively disposed in the third dielectric layer, surround the conductive through vias, and electrically connect the third inner circuit layer and the first inner circuit layer and the fourth inner circuit layer and the second inner circuit layer. The fourth dielectric layer respectively covers the third inner circuit layer and the fourth inner circuit layer. The first external circuit layer and the second external circuit layer respectively cover the fourth dielectric layer. The third annular retaining wall and the fourth annular retaining wall are respectively disposed in the fourth dielectric layer and electrically connect the first external circuit layer and the third inner circuit layer and the second external circuit layer and the fourth inner circuit layer.

A circuit board structure of the disclosure includes two circuit board units and a connection structural layer. Each circuit board unit includes a first inner circuit layer, a second inner circuit layer, a conductive connection layer, a second dielectric layer, two third dielectric layers, a third inner circuit layer, a fourth inner circuit layer, two conductive through vias, a first annular retaining wall, a second annular retaining wall, two fourth dielectric layers, a first external circuit layer, a second external circuit layer, a third annular retaining wall, and a fourth annular retaining wall. The first dielectric layer has a first surface and a second surface opposite to each other and an opening penetrating the first dielectric layer and connecting the first surface and the second surface. The first inner circuit layer is disposed on the first surface of the first dielectric layer. The second inner circuit layer is disposed on the second surface of the first dielectric layer. The conductive connection layer covers an inner wall of the opening of the first dielectric layer and connects the first inner circuit layer and the second inner circuit layer. The second dielectric layer fills the opening of the first dielectric layer. The third dielectric layer respectively covers the first inner circuit layer, the second inner circuit layer, and the second dielectric layer. The third inner circuit layer and the fourth inner circuit layer respectively cover the third dielectric layer. The conductive through vias penetrate the third dielectric layer and the second dielectric layer, and electrically connect the third inner circuit layer and the fourth inner circuit layer. The first annular retaining wall and the second annular retaining wall are respectively disposed in the third dielectric layer, surround the conductive through vias, and electrically connect the third inner circuit layer and the first inner circuit layer and the fourth inner circuit layer and the second inner circuit layer. The fourth dielectric layer respectively covers the third inner circuit layer and the fourth inner circuit layer. The first external circuit layer and the second external circuit layer respectively cover the fourth dielectric layer. The third annular retaining wall and the fourth annular retaining wall are respectively disposed in the fourth dielectric layer and electrically connect the first external circuit layer and the third inner circuit layer and the second external circuit layer and the fourth inner circuit layer. A part of at least one of the third annular retaining wall and the fourth annular retaining wall is disposed corresponding to the conductive through vias. The connection structural layer includes a connection layer and multiple conductive bonding portions. The connection layer is located between the circuit board units and covers the first external circuit layer of each circuit board unit, and the conductive bonding portions are connected to the first external circuit layer of each circuit board unit, so that the circuit board units are docked together.

Based on the above, in the design of the circuit board structure of the disclosure, the first annular retaining wall and the second annular retaining wall surround the conductive through vias and electrically connect the third inner circuit layer and the first inner circuit layer and the fourth inner circuit layer and the second inner circuit layer, and the third annular retaining wall and the fourth annular retaining wall electrically connect the first external circuit layer and the third inner circuit layer and the second external circuit layer and the fourth inner circuit layer. With such a design, the annular retaining walls present a closed boundary structure, which can reduce electromagnetic interference (EMI) and completely cover signals of the conductive through vias. Compared with the prior art in which single-row blind holes with gaps are disposed around the conductive through vias, the circuit board structure of the disclosure can also effectively prevent energy loss and reduce noise interference, so as to have preferred signal integrity.

In order for the features and advantages of the disclosure to be more comprehensible, the following specific embodiments are described in detail in conjunction with the drawings.

DETAILED DESCRIPTION OF DISCLOSED EMBODIMENTS

Figure 1A:
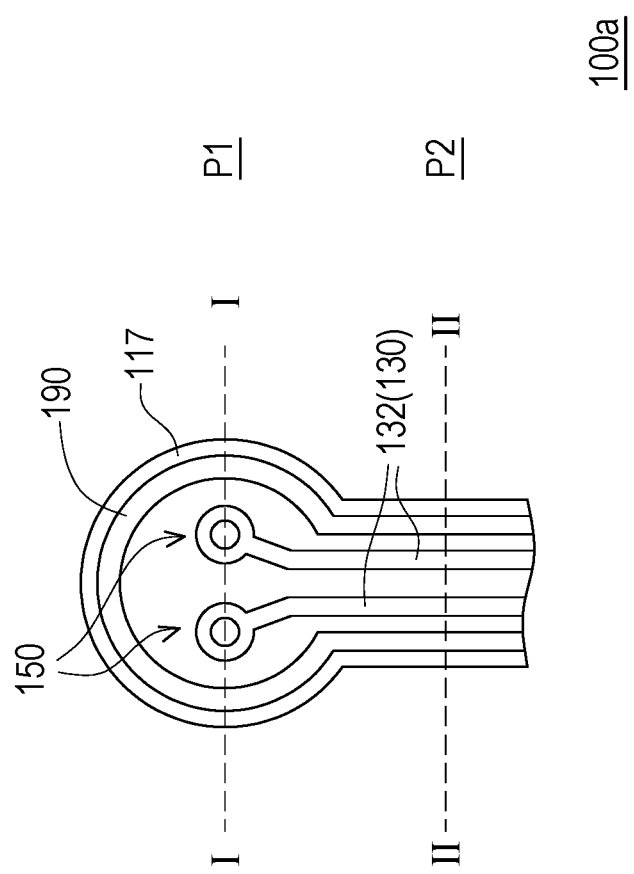
FIG. 1A is a schematic top view of a circuit board structure according to an embodiment of the disclosure.
Figure 1B:
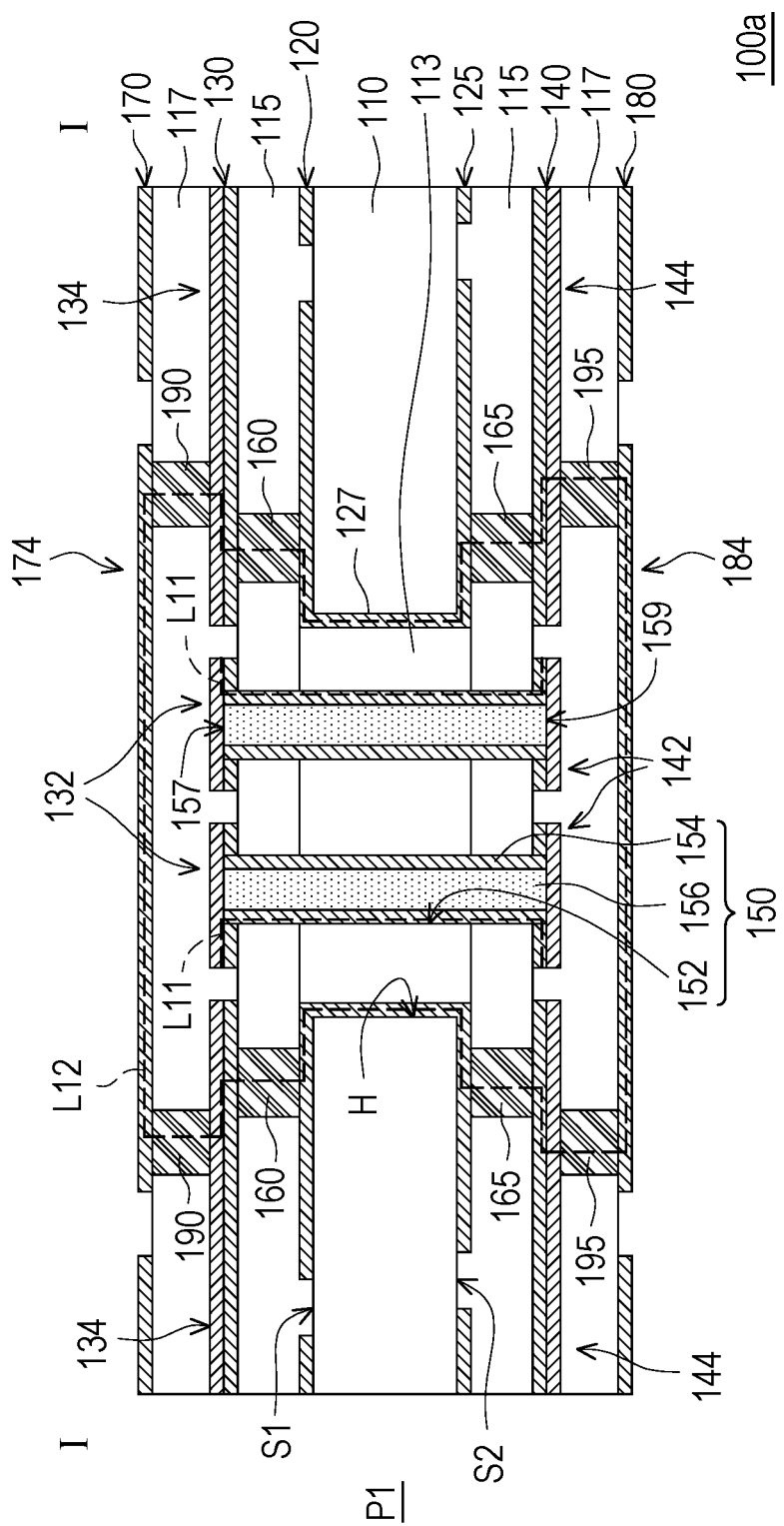
FIG. 1B is a schematic cross-sectional view along a line I-I of FIG. 1A.
Figure 1C:
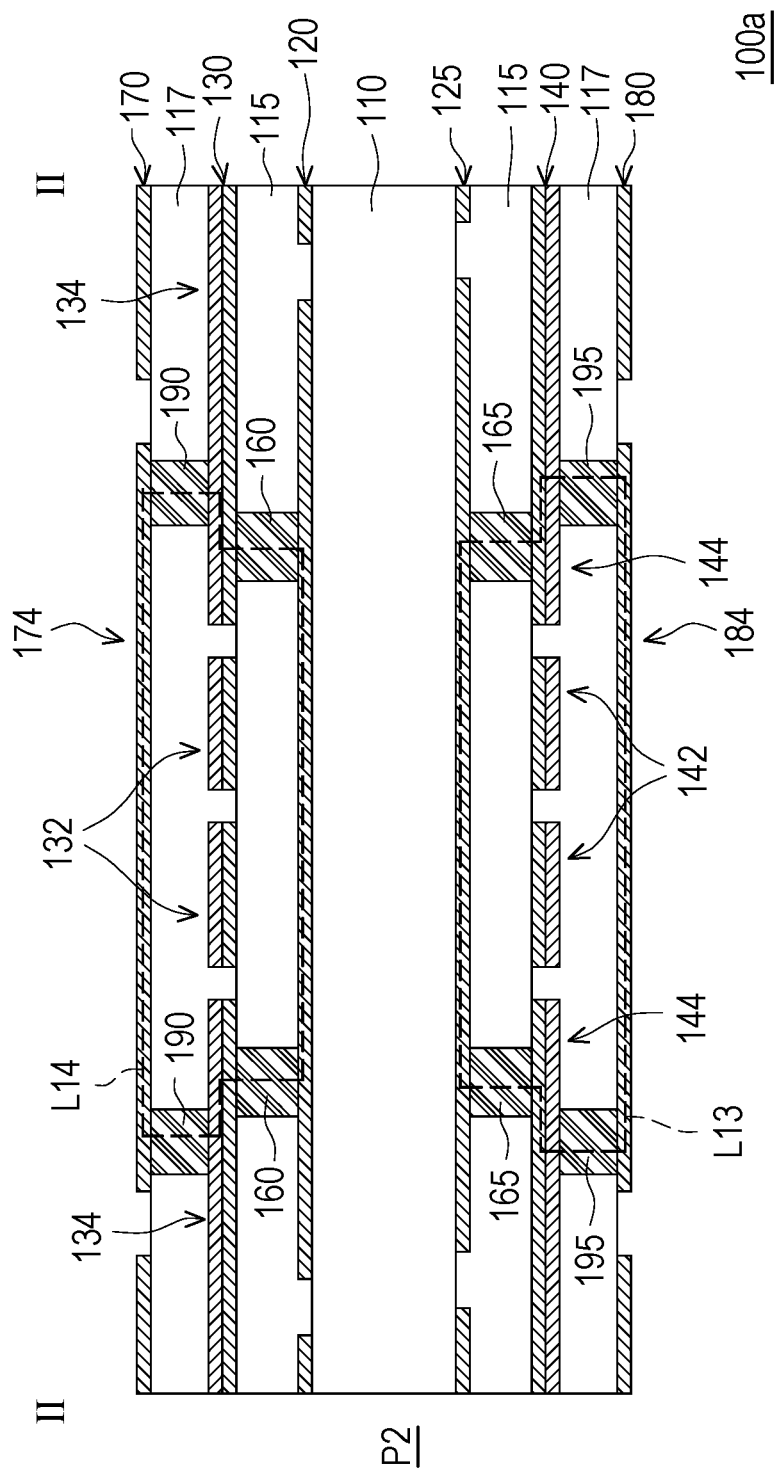
FIG. 1C is a schematic cross-sectional view along a line II-II of FIG. 1A.

FIG. 1A is a schematic top view of a circuit board structure according to an embodiment of the disclosure. FIG. 1B is a schematic cross-sectional view along a line I-I of FIG. 1A. FIG. 1C is a schematic cross-sectional view along a line II-II of FIG. 1A. It should be noted that FIG. 1B is a schematic cross-sectional view of the circuit board structure at a first position P1, and FIG. 1C is a cross-sectional view of the circuit board structure at a second position P2.

Please refer to FIG. 1A, FIG. 1B, and FIG. 1C. In this embodiment, a circuit board structure 100a includes a first dielectric layer 110, a second dielectric layer 113, two third dielectric layers 115, two fourth dielectric layers 117, a first inner circuit layer 120, a second inner circuit layer 125, a conductive connection layer 127, a third inner circuit layer 130, a fourth inner circuit layer 140, two conductive through vias 150, a first annular retaining wall 160, a second annular retaining wall 165, a first external circuit layer 170, a second external circuit layer 180, a third annular retaining wall 190, and a fourth annular retaining wall 195.

Specifically, in this embodiment, the first dielectric layer 110 has a first surface S1 and a second surface S2 opposite to each other and an opening H penetrating the first dielectric layer 110 and connecting the first surface S1 and the second surface S2. The first inner circuit layer 120 is disposed on the first surface S1 of the first dielectric layer 110. The second inner circuit layer 125 is disposed on the second surface S2 of the first dielectric layer 110. The conductive connection layer 127 covers an inner wall of the opening H of the first dielectric layer 110 and connects the first inner circuit layer 120 and the second inner circuit layer 125. The second dielectric layer 113 fills the opening H of the first dielectric layer 110 and aligns the first inner circuit layer 120 with the second inner circuit layer 125. Here, the first dielectric layer 110 may use a general dielectric material, wherein the dielectric constant of the first dielectric layer 110 may be lower than 5.0, and the dielectric loss (Df) of the first dielectric layer 110 may be lower than 0.02, so as to provide proper impedance matching. The dielectric constant of the second dielectric layer 113 may be lower than 5.0, and the dielectric loss (Df) of the second dielectric layer 113 is greater than 0 and less than 0.025, so as to provide proper insulation and impedance matching, and also reduce the dielectric loss.

Furthermore, the third dielectric layer 115 of this embodiment respectively covers the first inner circuit layer 120, the second inner circuit layer 125, and two opposite sides of the second dielectric layer 113. The third inner circuit layer 130 and the fourth inner circuit layer 140 respectively cover the third dielectric layer 115. The conductive through vias 150 penetrate the third dielectric layer 115 and the second dielectric layer 113, and electrically connect the third inner circuit layer 130 and the fourth inner circuit layer 140. More specifically, in this embodiment, each conductive through via 150 includes a through hole 152, a conductive material layer 154, and a hole filling material 156. The through hole 152 penetrates the third dielectric layer 115 and the second dielectric layer 113, and the conductive material layer 154 covers an inner wall of the through hole 152 and electrically connects the third inner circuit layer 130 and the fourth inner circuit layer 140. The hole filling material 156 fills the through hole 152, and the third inner circuit layer 130 and the fourth inner circuit layer 140 respectively cover an upper surface 157 and a lower surface 159 opposite to each other of the hole filling material 156.

Furthermore, the first annular retaining wall 160 and the second annular retaining wall 165 of this embodiment are respectively disposed in the third dielectric layer 115, surround the conductive through vias 150, and electrically connect the third inner circuit layer 130 and the first inner circuit layer 120 and the fourth inner circuit layer 140 and the second inner circuit layer 125. The fourth dielectric layer 117 respectively covers the third inner circuit layer 130 and the fourth inner circuit layer 140. The first external circuit layer 170 and the second external circuit layer 180 respectively cover the fourth dielectric layer 117. The third annular retaining wall 190 and the fourth annular retaining wall 195 are respectively disposed in the fourth dielectric layer 117 and electrically connect the first external circuit layer 170 and the third inner circuit layer 130 and the second external circuit layer 180 and the fourth inner circuit layer 140. Here, the third dielectric layer 115 and the fourth dielectric layer 117 may respectively be, for example, a photo imageable dielectric (PID) material, a pre-preg, or an Ajinomoto build-up film (ABF). The dielectric constants of the third dielectric layer 115 and the fourth dielectric layer 117 may be lower than 4.2, and the dielectric losses (Df) of the third dielectric layer 115 and the fourth dielectric layer 117 may be greater than 0 and less than 0.01.

In particular, in this embodiment, the third inner circuit layer 130, the conductive through vias 150, and the fourth inner circuit layer 140 define two signal paths L11, the first external circuit layer 170, the third annular retaining wall 190, the third inner circuit layer 130, the first annular retaining wall 160, the first inner circuit layer 120, the conductive connection layer 127, the second inner circuit layer 125, the second annular retaining wall 165, the fourth inner circuit layer 140, the fourth annular retaining wall 195, and the second external circuit layer 180 define a ground path L12, and the ground path L12 surrounds the signal paths L11.

Further, please refer to FIG. 1B. The first external circuit layer 170 includes a ground circuit 174 (that is, a first ground circuit). The second external circuit layer 180 includes a ground circuit 184 (that is, a second ground circuit). The third inner circuit layer 130 includes a signal circuit 132 (that is, a first signal circuit) and a ground circuit 134 (that is, a third ground circuit). The fourth inner circuit layer 140 includes a signal circuit 142 (that is, a second signal circuit) and a ground circuit 144 (that is, a fourth ground circuit). The signal circuit 132, the conductive through vias 150, and the signal circuit 142 define the signal paths L11, and the ground circuit 174, the third annular retaining wall 190, the ground circuit 134, the first annular retaining wall 160, the first inner circuit layer 120, the conductive connection layer 127, the second inner circuit layer 125, the second annular retaining wall 165, the ground circuit 144, the fourth annular retaining wall 195, and the second ground circuit 184 define the ground path L12. Since the signal paths L11 are surrounded and enclosed in a closed manner by the ground path L12, a good high-frequency high-speed loop can be formed.

In addition, please refer to FIG. 1C. The ground circuit 174, the third annular retaining wall 190, the ground circuit 134, the first annular retaining wall 160, and the first inner circuit layer 120 define a ground path L14, and the ground path L14 surrounds and encloses the signal circuit 132 in a closed manner, so a good high-frequency high-speed loop can be formed. Furthermore, the second inner circuit layer 125, the second annular retaining wall 165, the ground circuit 144, the fourth annular retaining wall 195, and the ground circuit 184 define a ground path L13, and the ground path L13 surrounds and encloses the signal circuit 142 in a closed manner, so a good high-frequency high-speed loop can be formed.

In short, in this embodiment, the signal paths L11 defined by the signal circuit 132, the conductive through vias 150, and the signal circuit 142 are surrounded and enclosed by the ground path L12 defined by the ground circuit 174, the third annular retaining wall 190, the ground circuit 134, the first annular retaining wall 160, the first inner circuit layer 120, the conductive connection layer 127, the second inner circuit layer 125, the second annular retaining wall 165, the ground circuit 144, the fourth annular retaining wall 195, and the second ground circuit 184. That is, the ground path L12 with good enclosure is disposed around the signal paths L11 that may transmit high-frequency high-speed signals such as 5G, so that a good high-frequency high-speed loop can be formed, and the circuit board structure 100 of this embodiment can have preferred signal integrity. Here, the high frequency refers to frequency greater than 1 GHz; and the high speed refers to data transmission speed greater than 100 Mbps.

Furthermore, since the first annular retaining wall 160, the second annular retaining wall 165, the third annular retaining wall 190, and the fourth annular retaining wall 195 present a closed boundary structure, signals of the conductive through vias 150. can be completely covered. Compared with the prior art in which single-row blind holes with gaps are disposed around the conductive through vias, the circuit board structure 100a of the embodiment can effectively prevent energy loss and reduce noise interference to have preferred signal integrity. In addition, the conductive through vias 150, the conductive connection layer 127, and the second dielectric layer 113 define a coaxial via, wherein the second dielectric layer 113 is located between the conductive through vias 150 and the conductive connection layer 127. Compared with the prior art in which the inner conductor layer and the outer conductor layer of the coaxial via are insulated by the build-up method of laminating the insulating layers, a manufacturing method of the circuit board structure 100a of this embodiment can avoid the issue of impedance mismatch that affects the integrity of high-frequency signals.

Figure 2A:
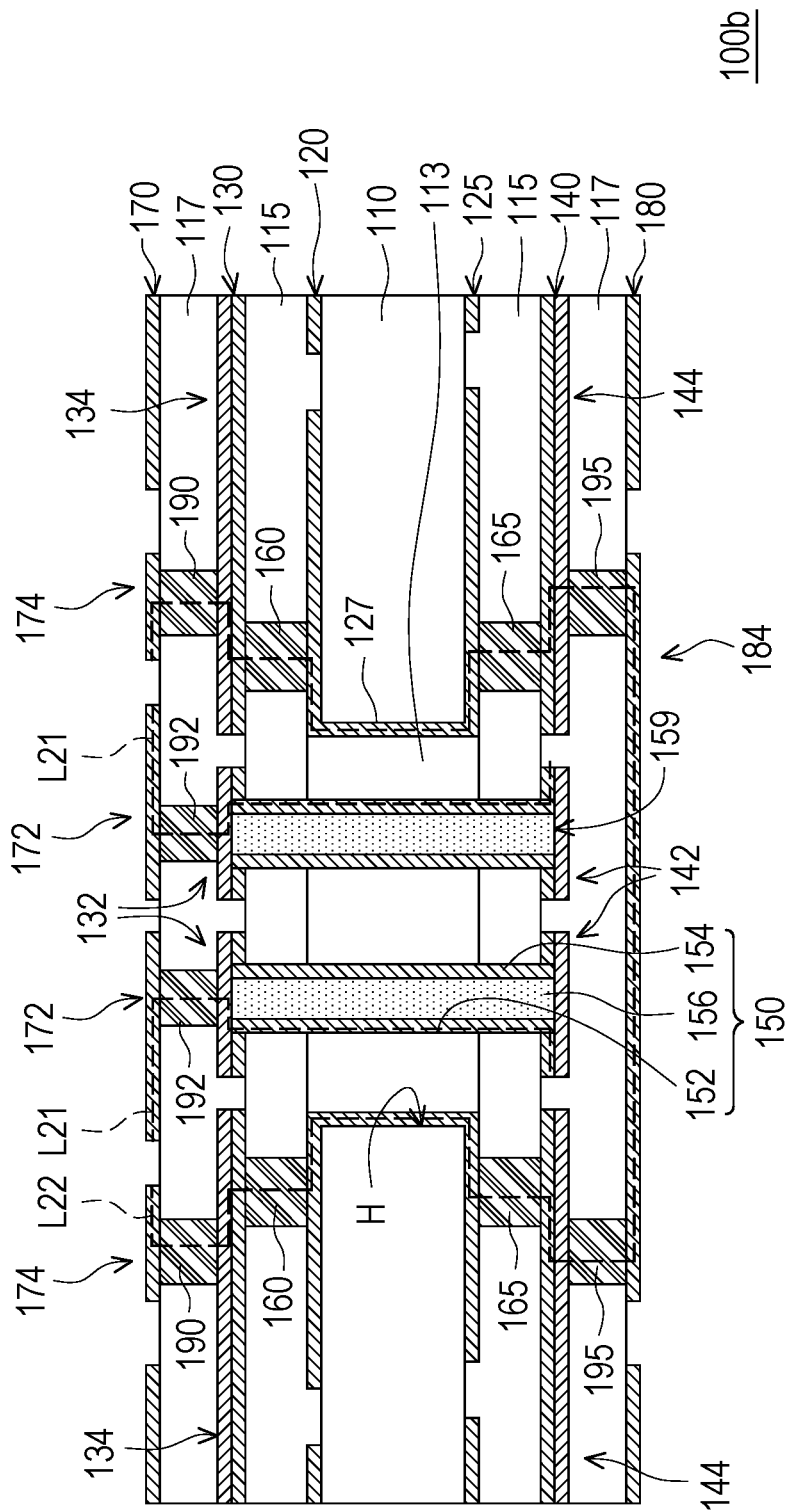
FIG. 2A and FIG. 2B are schematic cross-sectional views of a circuit board structure at a first position and a second position according to another embodiment of the disclosure.
Figure 2B:
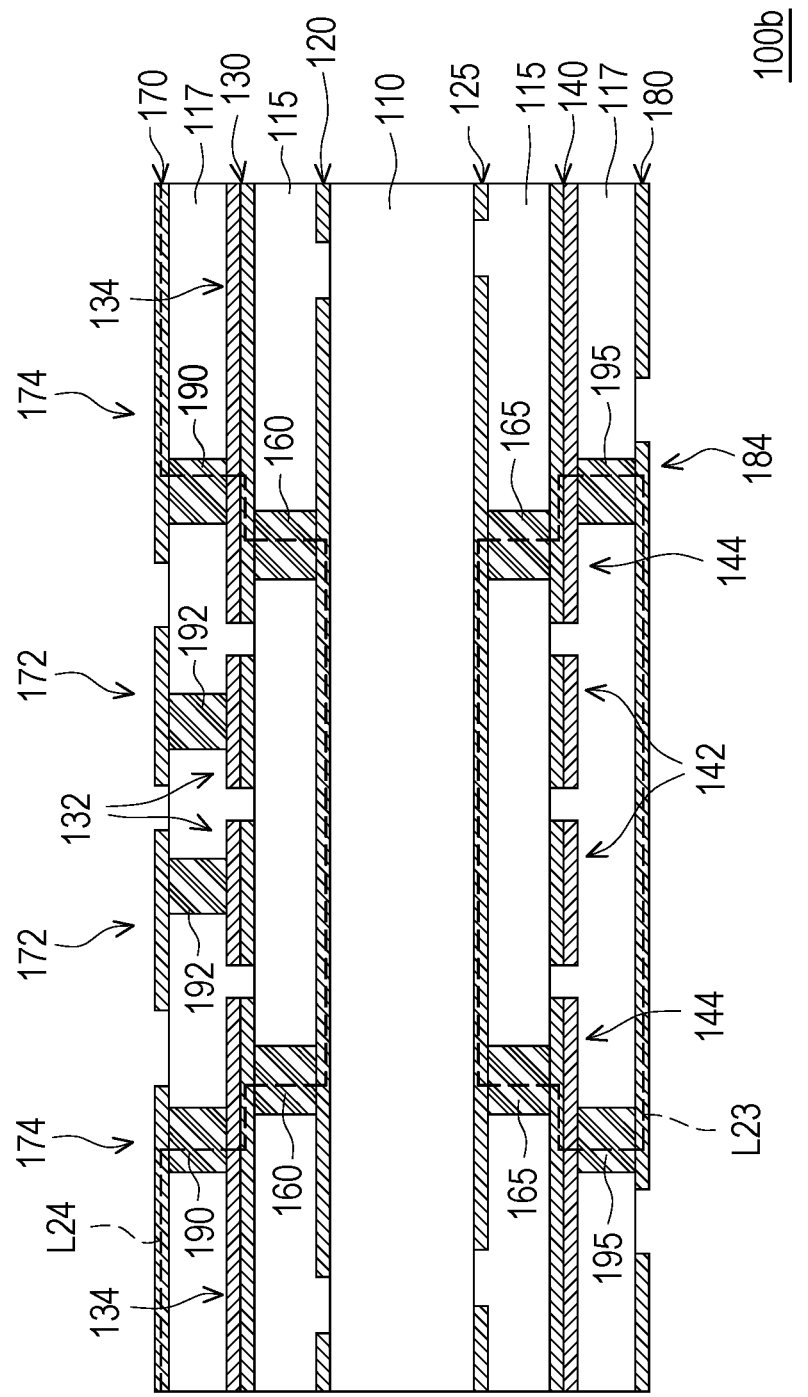

FIG. 2A and FIG. 2B are schematic cross-sectional views of a circuit board structure at a first position and a second position according to another embodiment of the disclosure. Please refer first to FIG. 2A. In order to improve the application of a circuit board structure 100b, a third annular retaining wall 192 of this embodiment may be disposed corresponding to the conductive through vias 150. Here, the first external circuit layer 170 includes a signal circuit 172 and a ground circuit 174. The signal circuit 172, the third annular retaining wall 192, the signal circuit 132, the conductive through vias 150, and the signal circuit 142 define a signal path L21. The ground circuit 174, the third annular retaining wall 190, the ground circuit 134, the first annular retaining wall 160, the first inner circuit layer 120, the conductive connection layer 127, the second inner circuit layer 125, the second annular retaining wall 165, the ground circuit 144, the fourth annular retaining wall 195, and the ground circuit 184 define a ground path L22. Since the signal path L21 is surrounded and enclosed by the ground path L22 in a closed manner, a good high-frequency high-speed loop can be formed.

Please refer to FIG. 2B. The ground circuit 174, the third annular retaining wall 190, the ground circuit 134, the first annular retaining wall 160, and the first inner circuit layer 120 of the circuit board structure 100b define a ground path L24, and the ground path L24 surrounds and encloses the signal circuit 132 in a closed manner, so a good high-frequency high-speed loop can be formed. In addition, the second inner circuit layer 125, the second annular retaining wall 165, the ground circuit 144, the fourth annular retaining wall 195, and the ground circuit 184 of the circuit board structure 100b define a ground path L23, and the ground path L23 surrounds and encloses the signal circuit 142 in a closed manner, so a good high-frequency high-speed loop can be formed.

Figure 3:
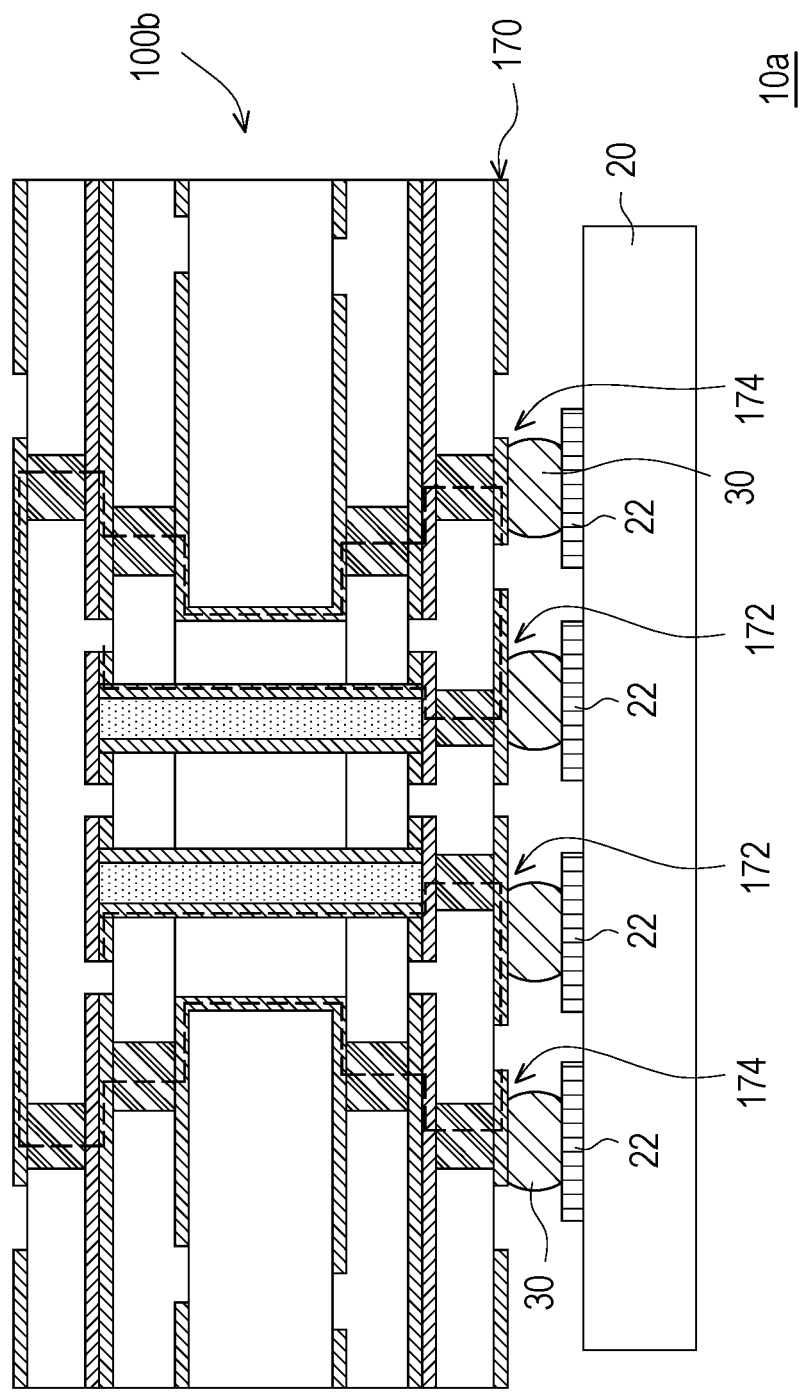
FIG. 3 is a schematic partial cross-sectional view of an electronic device including the circuit board structure of FIG. 2A and FIG. 2B.

FIG. 3 is a schematic partial cross-sectional view of an electronic device including the circuit board structure of FIG. 2. In this embodiment, an electronic device 10a includes, for example, the circuit board structure 100b of FIG. 2 and an electronic element 20, wherein the electronic element 20 is electrically connected to the circuit board structure 100b, and the electronic element 20 includes multiple pads 22. In addition, the electronic device 10a of this embodiment further includes multiple connectors 30, which are disposed between the first external circuit layer 170 of the circuit board structure 100b and the pads 22 of the electronic element 20, wherein the electronic element 20 is electrically connected to the circuit board structure 100b through the connectors 30. Here, the connector 30 is, for example, a solder ball, but not limited thereto. In terms of application, an antenna structure may be disposed on the other side of the circuit board structure 100b opposite to the electronic element 20, which can solve the issue of signal interference on the same plane, reduce signal energy loss, and reduce noise interference, thereby improving the reliability of signal transmission.

Figure 4:
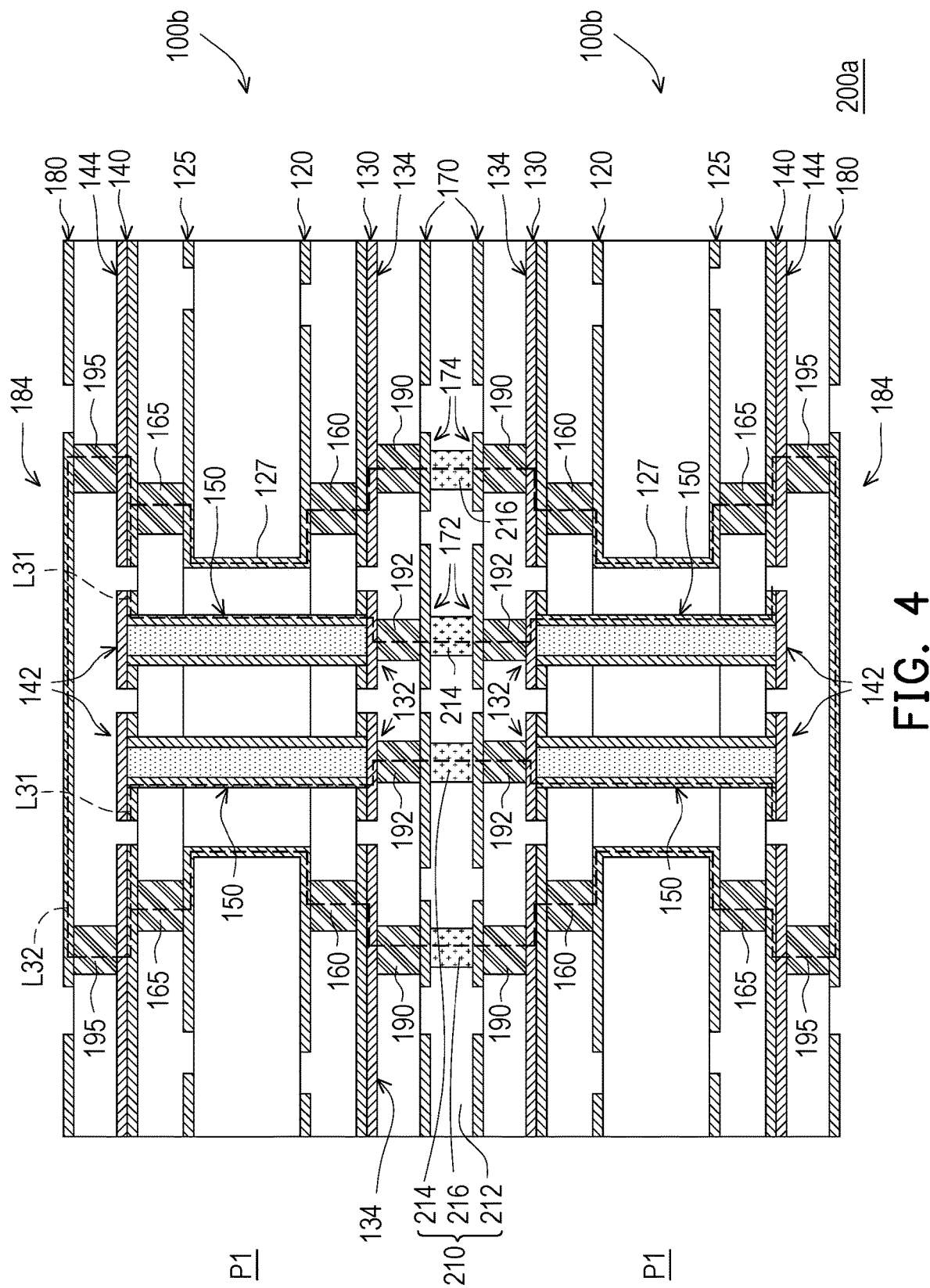
FIG. 4 is a schematic partial cross-sectional view of a circuit board structure according to an embodiment of the disclosure.

FIG. 4 is a schematic partial cross-sectional view of a circuit board structure according to an embodiment of the disclosure. Please refer to FIG. 2 and FIG. 4 at the same time. In this embodiment, the circuit board structure 200a includes two circuit board units and a connection structural layer 210, wherein each circuit board unit is the circuit board structure 100b in FIG. 2. The first external circuit layer 170 of the circuit board structure 100b includes the signal circuit 172 (that is, the first signal circuit) and the ground circuit 174 (that is, the first ground circuit). The second external circuit layer 180 includes the ground circuit 184 (that is, the second ground circuit). The third inner circuit layer 130 includes the signal circuit 132 (that is, the third signal circuit) and the ground circuit 134 (that is, the third ground circuit). The fourth inner circuit layer 140 includes the signal circuit 142 (that is, the fourth signal circuit) and the ground circuit 144 (that is, the fourth ground circuit). The connection structural layer 210 includes a connection layer 212 and multiple conductive bonding portions (including multiple first conductive bonding portions 214 and multiple second conductive bonding portions 216). The connection layer 212 is located between the two circuit board structures 100b and covers the first external circuit layer 170 of each circuit board structure 100b. The first conductive bonding portion 214 and the second conductive bonding portion 216 are connected to the first external circuit layer 170 of each circuit board structure 100b, so that the circuit board structures 100b are docked together. Here, the first conductive bonding portions 214 are disposed corresponding to the conductive through vias 150 of the circuit board structure 100b and are connected to the signal circuit 172. The second conductive bonding portions 216 surround the first conductive bonding portions 214 and are connected to the ground circuit 174.

In this embodiment, the upper circuit board structure 100b is located at the first position P1 and the lower circuit board structure 100b is located at the first position P1, and when the circuit board structure 100b and the circuit board structure 100b are docked together, the signal circuit 142, the conductive through vias 150, the signal circuit 132, the third annular retaining wall 192 corresponding to the conductive through vias 150, the signal circuit 172, and the first conductive bonding portions 214 of the upper circuit board structure 100b, and the signal circuit 172, the third annular retaining wall 192 corresponding to the conductive through vias 150, the signal circuit 132, the conductive through vias 150, and the signal circuit 142 of the lower circuit board structure 100b define two signal paths L31. The ground circuit 184, the fourth annular retaining wall 195, the ground circuit 144, the second annular retaining wall 165, the second inner circuit layer 125, the conductive connection layer 127, the first inner circuit layer 120, the first annular retaining wall 160, the ground circuit 134, the third annular retaining wall 190, the ground circuit 174, and the second conductive bonding portions 216 of the upper circuit board structure 100b, and the ground circuit 174, the third annular retaining wall 190, the ground circuit 134, the first annular retaining wall 160, the first inner circuit layer 120, the conductive connection layer 127, the second inner circuit layer 125, the second annular retaining wall 165, the ground circuit 144, the fourth annular retaining wall 195, and the ground circuit 184 of the lower circuit board structure 100b define a ground path L32, and the ground path L32 surrounds the signal paths L31. Since the signal paths L31 are surrounded and enclosed by the ground path L32 in a closed manner, a good high-frequency high-speed loop can be formed.

Figure 5:
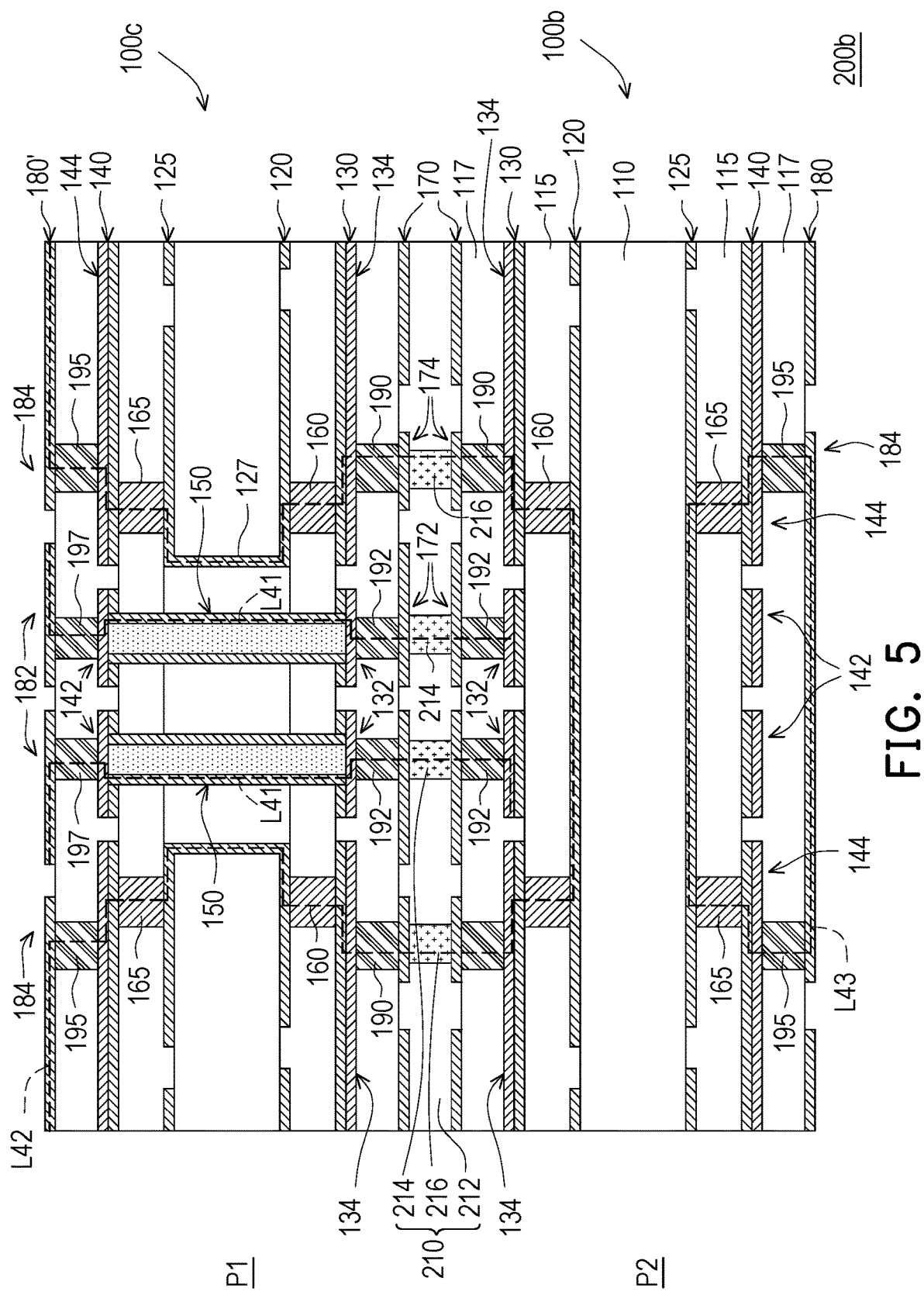
FIG. 5 is a schematic partial cross-sectional view of a circuit board structure according to an embodiment of the disclosure.

FIG. 5 is a schematic partial cross-sectional view of a circuit board structure according to an embodiment of the disclosure. Please refer to FIG. 5. In this embodiment, a circuit board structure 200b includes two circuit board units and a connection structural layer 210, wherein the circuit board units are the circuit board structure 100b in FIG. 2B and a circuit board structure 100c. Here, the circuit board structure 100c is similar to the circuit board structure 100b in FIG. 2A, and the difference is only that a second external circuit layer 180' of this embodiment further includes a signal circuit 182 (that is, a second signal circuit), and a fourth annular retaining wall 197 and a third annular retaining wall 192 are disposed corresponding to the conductive through vias 150.

When the upper circuit board structure 100c is located at the first position P1 and the lower circuit board structure 100b is located at the second position P2, and the circuit board structure 100c and the circuit board structure 100b are docked together, the signal circuit 182, the fourth annular retaining wall 197 disposed corresponding to the conductive through vias 150, the signal circuit 142, the conductive through vias 150, the signal circuit 132, the third annular retaining wall 192 disposed corresponding to the conductive through vias 150, the signal circuit 172, and the first conductive bonding portions 214 of the upper circuit board structure 100b, and the signal circuit 172, the third annular retaining wall 192 disposed corresponding to the conductive through vias 150, and the signal circuit 132 of the lower circuit board structure 100b define two signal paths L41. The ground circuit 184, the fourth annular retaining wall 195, the ground circuit 144, the second annular retaining wall 165, the second inner circuit layer 125, the conductive connection layer 127, the first inner circuit layer 120, the first annular retaining wall 160, the ground circuit 134, the third annular retaining wall 190, the ground circuit 174, and the second conductive bonding portions 216 of the upper circuit board structure 100b, and the ground circuit 174, the third annular retaining wall 190, the ground circuit 134, the first annular retaining wall 160, and the first inner circuit layer 120 of the lower circuit board structure 100b define a ground path L42 (that is, a first ground path), and the first ground path L42 surrounds the signal paths L41. Since the signal paths L41 are surrounded and enclosed by the ground path L42 in a closed manner, a good high-frequency high-speed loop can be formed.

In addition, the second inner circuit layer 125, the second annular retaining wall 165, the ground circuit 144, the fourth annular retaining wall 195, and the ground circuit 184 of the lower circuit board structure 100b define a ground path L43 (that is, a second ground path), and the ground path L43 surrounds and encloses the signal circuit 142 of the circuit board structure 100b in a closed manner, so a good high-frequency high-speed loop can be formed.

Figure 6:
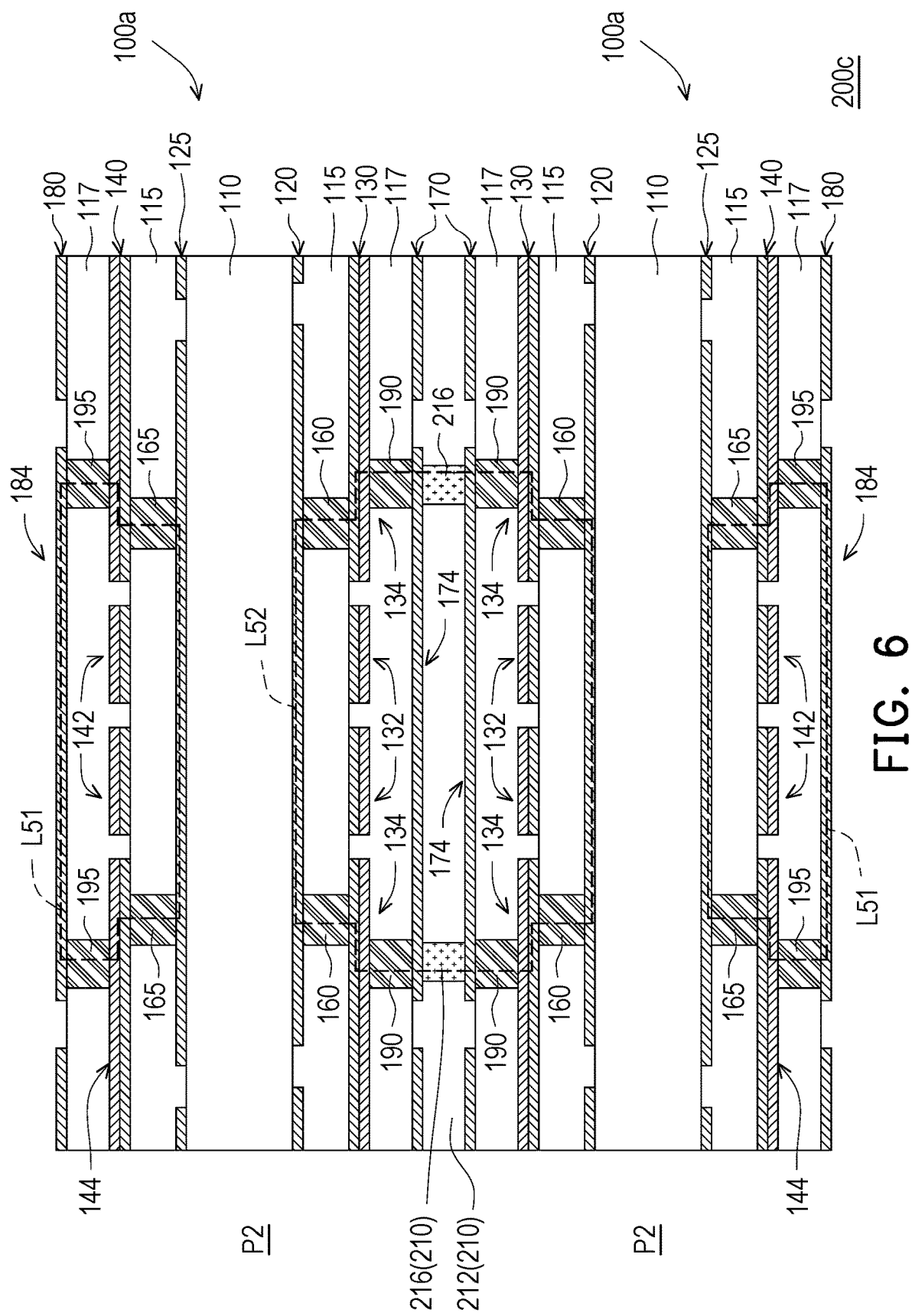
FIG. 6 is a schematic partial cross-sectional view of a circuit board structure according to an embodiment of the disclosure.

FIG. 6 is a schematic partial cross-sectional view of a circuit board structure according to an embodiment of the disclosure. Please refer to FIG. 6. In this embodiment, a circuit board structure 200c includes two circuit board units and a connection structural layer 210, wherein each circuit board unit is the circuit board structure 100a in FIG. 1C.

When the upper circuit board structure 100a is located at the second position P2 and the lower circuit board structure 100a is located at the second position P2, and the circuit board structure 100a and the circuit board structure 100a are docked together, the second inner circuit layer 125, the second annular retaining wall 165, the ground circuit 144, the fourth annular retaining wall 195, and the ground circuit 184 of the upper circuit board structure 100a define a ground path L51, and the ground path L51 surrounds and encloses the signal circuit 142 in a closed manner, so a good high-frequency high-speed loop can be formed.

Furthermore, the first inner circuit layer 120, the first annular retaining wall 160, the ground circuit 134, the third annular retaining wall 190, the ground circuit 174, the second conductive bonding portions 216, the ground circuit 174, the third annular retaining wall 190, the ground circuit 134, the first annular retaining wall 160, and the first inner circuit layer 120 of the upper circuit board structure 100a define a ground path L52, and the ground path L52 surrounds and encloses the signal circuit 132 in a closed manner, so a good high-frequency high-speed loop can be formed. In addition, the second inner circuit layer 125, the second annular retaining wall 165, the ground circuit 144, the fourth annular retaining wall 195, and the ground circuit 184 of the lower circuit board structure 100a define a ground path L51, and the ground path L51 surrounds and encloses the signal circuit 142 in a closed manner, so a good high-frequency high-speed loop can be formed.

It should be noted that the docking manners mentioned in the above embodiments are all docking the first external circuit layers of the two circuit board structures together. Of course, in other embodiments not shown, the docking manner may also be docking a first external circuit layer of one circuit board structure to a second external circuit layer of another circuit board structure; or docking second external circuit layers of two circuit board structures together, which all belong to the protection scope of the disclosure.

Figure 7:
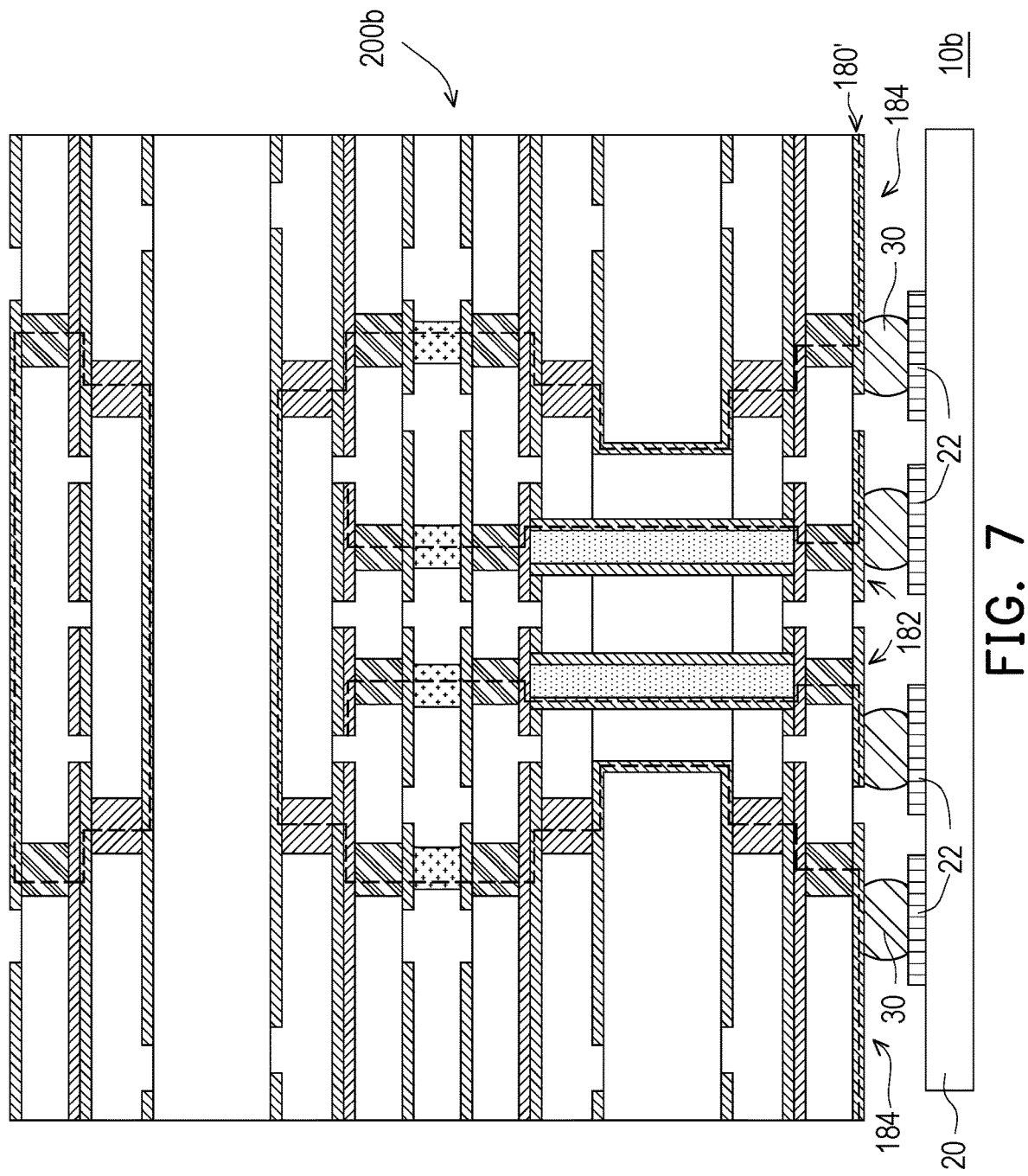
FIG. 7 is a schematic partial cross-sectional view of an electronic device including the circuit board structure of FIG. 5.

FIG. 7 is a schematic partial cross-sectional view of an electronic device including the circuit board structure of FIG. 5. Please refer to FIG. 7. In this embodiment, an electronic device 10b includes, for example, the circuit board structure 200b of FIG. 5 and an electronic element 20, wherein the electronic element 20 is electrically connected to the circuit board structure 200b, and the electronic element 20 includes multiple pads 22. In addition, the electronic device 10b of this embodiment further includes multiple connectors 30, which are disposed between a second external circuit layer 180' of the circuit board structure 200b and the pads 22 of the electronic element 20, wherein the electronic element 20 is electrically connected to the circuit board structure 200b through the connectors 30. Here, the connector 30 is, for example, a solder ball, but not limited thereto. In terms of application, an antenna structure may be disposed on the other side of the circuit board structure 200b opposite to the electronic element 20, which can solve the issue of signal interference on the same plane, reduce signal energy loss, and reduce noise interference, thereby improving the reliability of signal transmission.

In summary, in the design of the circuit board structure of the disclosure, the first annular retaining wall and the second annular retaining wall surround the conductive through vias and electrically connect the third inner circuit layer and the first inner circuit layer and the fourth inner circuit layer and the second inner circuit layer, and the third annular retaining wall and the fourth annular retaining wall electrically connect the first external circuit layer and the third inner circuit layer and the second external circuit layer and the fourth inner circuit layer. With such a design, the annular retaining walls present a closed boundary structure, which can reduce electromagnetic interference (EMI) and completely cover signals of the conductive through vias. Compared with the prior art in which single-row blind holes with gaps are disposed around the conductive through vias, the circuit board structure of the disclosure can also effectively prevent energy loss and reduce noise interference, so as to have preferred signal integrity.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A circuit board structure, comprising:
   a first dielectric layer, having a first surface and a second surface opposite to each other and an opening penetrating the first dielectric layer and connecting the first surface and the second surface;
   a first inner circuit layer, disposed on the first surface of the first dielectric layer;
   a second inner circuit layer, disposed on the second surface of the first dielectric layer;
   a conductive connection layer, covering an inner wall of the opening of the first dielectric layer and connecting the first inner circuit layer and the second inner circuit layer;
   a second dielectric layer, filling the opening of the first dielectric layer;
   two third dielectric layers, respectively covering the first inner circuit layer, the second inner circuit layer, and the second dielectric layer;
   a third inner circuit layer and a fourth inner circuit layer, respectively covering the third dielectric layers;
   two conductive through vias, penetrating the third dielectric layers and the second dielectric layer, and electrically connecting the third inner circuit layer and the fourth inner circuit layer;
   a first annular retaining wall and a second annular retaining wall, respectively disposed in the third dielectric layers, surrounding the conductive through vias, and electrically connecting the third inner circuit layer and the first inner circuit layer and the fourth inner circuit layer and the second inner circuit layer;
   two fourth dielectric layers, respectively covering the third inner circuit layer and the fourth inner circuit layer;
   a first external circuit layer and a second external circuit layer, respectively covering the fourth dielectric layers; and
   a third annular retaining wall and a fourth annular retaining wall, respectively disposed in the fourth dielectric layers and electrically connecting the first external circuit layer and the third inner circuit layer and the second external circuit layer and the fourth inner circuit layer.

2. The circuit board structure according to claim 1, wherein the third inner circuit layer, the conductive through vias, and the fourth inner circuit layer define two signal paths, the first external circuit layer, the third annular retaining wall, the third inner circuit layer, the first annular retaining wall, the first inner circuit layer, the conductive connection layer, the second inner circuit layer, the second annular retaining wall, the fourth inner circuit layer, the fourth annular retaining wall, and the second external circuit layer define a ground path, and the ground path surrounds the signal paths.

3. The circuit board structure according to claim 2, wherein the first external circuit layer comprises a first ground circuit, the second external circuit layer comprises a second ground circuit, the third inner circuit layer comprises a first signal circuit and a third ground circuit, the fourth inner circuit layer comprises a second signal circuit and a fourth ground circuit, the first signal circuit, the conductive through vias, and the second signal circuit define the signal paths, and the first ground circuit, the third annular retaining wall, the third ground circuit, the first annular retaining wall, the first inner circuit layer, the conductive connection layer, the second inner circuit layer, the second annular retaining wall, the fourth ground circuit, the fourth annular retaining wall, and the second ground circuit define the ground path.

4. The circuit board structure according to claim 1, wherein each of the conductive through vias comprises a through hole, a conductive material layer, and a hole filling material, the through hole penetrates the third dielectric layers and the second dielectric layer, the conductive material layer covers an inner wall of the through hole and electrically connects the third inner circuit layer and the fourth inner circuit layer, the hole filling material fills the through hole, and the third inner circuit layer and the fourth inner circuit layer respectively cover an upper surface and a lower surface opposite to each other of the hole filling material.

5. The circuit board structure according to claim 1, wherein a part of at least one of the third annular retaining wall and the fourth annular retaining wall is disposed corresponding to the conductive through vias.

6. A circuit board structure, comprising:
two circuit board units, each of the circuit board units comprising:
  a first dielectric layer, having a first surface and a second surface opposite to each other and an opening penetrating the first dielectric layer and connecting the first surface and the second surface;
  a first inner circuit layer, disposed on the first surface of the first dielectric layer;
  a second inner circuit layer, disposed on the second surface of the first dielectric layer;
  a conductive connection layer, covering an inner wall of the opening of the first dielectric layer and connecting the first inner circuit layer and the second inner circuit layer;
  a second dielectric layer, filling the opening of the first dielectric layer;
  two third dielectric layers, respectively covering the first inner circuit layer, the second inner circuit layer, and the second dielectric layer;
  a third inner circuit layer and a fourth inner circuit layer, respectively covering the third dielectric layers;
  two conductive through vias, penetrating the third dielectric layers and the second dielectric layer, and electrically connecting the third inner circuit layer and the fourth inner circuit layer;
  a first annular retaining wall and a second annular retaining wall, respectively disposed in the third dielectric layers, surrounding the conductive through vias, and electrically connecting the third inner circuit layer and the first inner circuit layer and the fourth inner circuit layer and the second inner circuit layer;
  two fourth dielectric layers, respectively covering the third inner circuit layer and the fourth inner circuit layer;
  a first external circuit layer and a second external circuit layer, respectively covering the fourth dielectric layers; and
  a third annular retaining wall and a fourth annular retaining wall, respectively disposed in the fourth dielectric layers and electrically connecting the first external circuit layer and the third inner circuit layer and the second external circuit layer and the fourth inner circuit layer, wherein a part of at least one of the third annular retaining wall and the fourth annular retaining wall is disposed corresponding to the conductive through vias; and
a connection structural layer, comprising a connection layer and a plurality of conductive bonding portions, wherein the connection layer is located between the circuit board units and covers the first external circuit layer of each of the circuit board units, and the conductive bonding portions are connected to the first external circuit layer of each of the circuit board units, so that the circuit board units are docked together.

7. The circuit board structure according to claim 6, wherein the first external circuit layer of each of the circuit board units comprises a first signal circuit and a first ground circuit, the second external circuit layer comprises a second signal circuit and a second ground circuit, the third inner circuit layer comprises a third signal circuit and a third ground circuit, the fourth inner circuit layer comprises a fourth signal circuit and a fourth ground circuit, the conductive bonding portions comprise a plurality of first conductive bonding portions and a plurality of second conductive bonding portions, the first conductive bonding portions are disposed corresponding to the conductive through vias of each of the circuit board units and are connected to the first signal circuit, and the second conductive bonding portions surround the first conductive bonding portions and are connected to the first ground circuit.

8. The circuit board structure according to claim 7, wherein when the circuit board units are docked together, the fourth signal circuit, the conductive through vias, the third signal circuit, the third annular retaining wall corresponding to the conductive through vias, the first signal circuit, and the first conductive bonding portions of one of the circuit board units, and the first signal circuit, the third annular retaining wall corresponding to the conductive through vias, the third signal circuit, the conductive through vias, and the fourth signal circuit of other one of the circuit board units define two signal paths, the second ground circuit, the fourth annular retaining wall, the fourth ground circuit, the second annular retaining wall, the second inner circuit layer, the conductive connection layer, the first inner circuit layer, the first annular retaining wall, the third ground circuit, the third annular retaining wall, the first ground circuit, and the second conductive bonding portions of one of the circuit board units, and the first ground circuit, the third annular retaining wall, the third ground circuit, the first annular retaining wall, the first inner circuit layer, the conductive connection layer, the second inner circuit layer, the second annular retaining wall, the fourth ground circuit, the fourth annular retaining wall, and the second ground circuit of other one of the circuit board units define a ground path, and the ground path surrounds the signal paths.

9. The circuit board structure according to claim 7, wherein a part of the third annular retaining wall and a part of the fourth annular retaining wall are disposed corresponding to the conductive through vias, when the circuit board units are docked together, the second signal circuit, the fourth annular retaining wall disposed corresponding to the conductive through vias, the fourth signal circuit, the conductive through vias, the third signal circuit, the third annular retaining wall disposed corresponding to the conductive through vias, the first signal circuit, and the first conductive bonding portions of one of the circuit board units, and the first signal circuit, the third annular retaining wall disposed corresponding to the conductive through vias, and the third signal circuit of other one of the circuit board units define two signal paths, the second ground circuit, the fourth annular retaining wall, the fourth ground circuit, the second annular retaining wall, the second inner circuit layer, the conductive connection layer, the first inner circuit layer, the first annular retaining wall, the third ground circuit, the third annular retaining wall, the first ground circuit, and the second conductive bonding portions of one of the circuit board units, and the first ground circuit, the third annular retaining wall, the third ground circuit, the first annular retaining wall, and the first inner circuit layer of other one of the circuit board units define a first ground path, the first ground path surrounds the signal paths, the second inner circuit layer, the second annular retaining wall, the fourth ground circuit, the fourth annular retaining wall, and the second ground circuit of other one of the circuit board units define a second ground path, and the second ground path surrounds the fourth signal circuit of other one of the circuit board units.

10. The circuit board structure according to claim 7, wherein when the circuit board units are docked together, the second ground circuit, the fourth annular retaining wall, the fourth ground circuit, the second annular retaining wall, and the second inner circuit layer of each of the circuit board units define a first ground path, the first ground path surrounds the fourth signal circuit, the first inner circuit layer, the first annular retaining wall, the third ground circuit, the third annular retaining wall, and the first ground circuit of each of the circuit board units define a second ground path, and the second ground path surrounds the third signal circuit.

* * * * *